United States Patent [19]
Smith

[11] Patent Number: 5,631,584
[45] Date of Patent: May 20, 1997

[54] DIFFERENTIAL CROSS COUPLED PEAK DETECTOR

[75] Inventor: Michael D. Smith, Flower Mound, Tex.

[73] Assignee: Dallas Semiconductor Corporation, Dallas, Tex.

[21] Appl. No.: 537,214

[22] Filed: Sep. 29, 1995

[51] Int. Cl.[6] .......................... G01R 19/00; H03K 5/153
[52] U.S. Cl. .................................. 327/62; 327/58
[58] Field of Search ........................ 327/62, 58–61, 327/91, 354

[56] References Cited

U.S. PATENT DOCUMENTS

| 4,866,301 | 9/1989 | Smith | 327/58 |
| 5,003,196 | 3/1991 | Kawaguchi | 327/62 |
| 5,159,340 | 10/1992 | Smith | 327/58 |
| 5,491,434 | 2/1996 | Harnishfeger et al. | 327/58 |

FOREIGN PATENT DOCUMENTS

| 4-346070 | 12/1992 | Japan | 327/62 |

*Primary Examiner*—Toan Tran
*Attorney, Agent, or Firm*—Jenkens & Gilchrist

[57] ABSTRACT

The present invention overcomes the aforementioned shortcomings and deficiencies of the prior art by providing a circuit for processing an AC signal having a peak to peak envelope associated therewith, this circuit including structure for detecting the upper edge of the peak to peak envelope of the AC signal, structure for detecting the lower edge of the peak to peak envelope of the AC signal, structure for sampling the AC signal at a mid range upper point, and structure for sampling the AC signal at a mid range lower point.

16 Claims, 2 Drawing Sheets

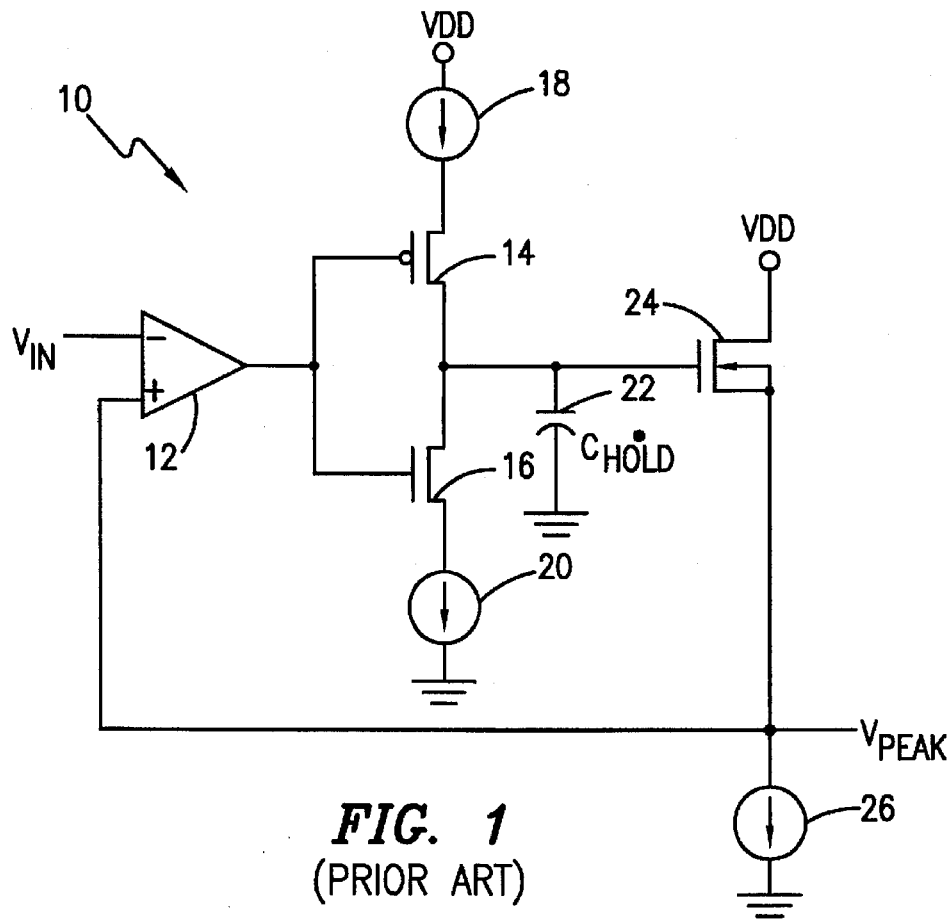
FIG. 1
(PRIOR ART)
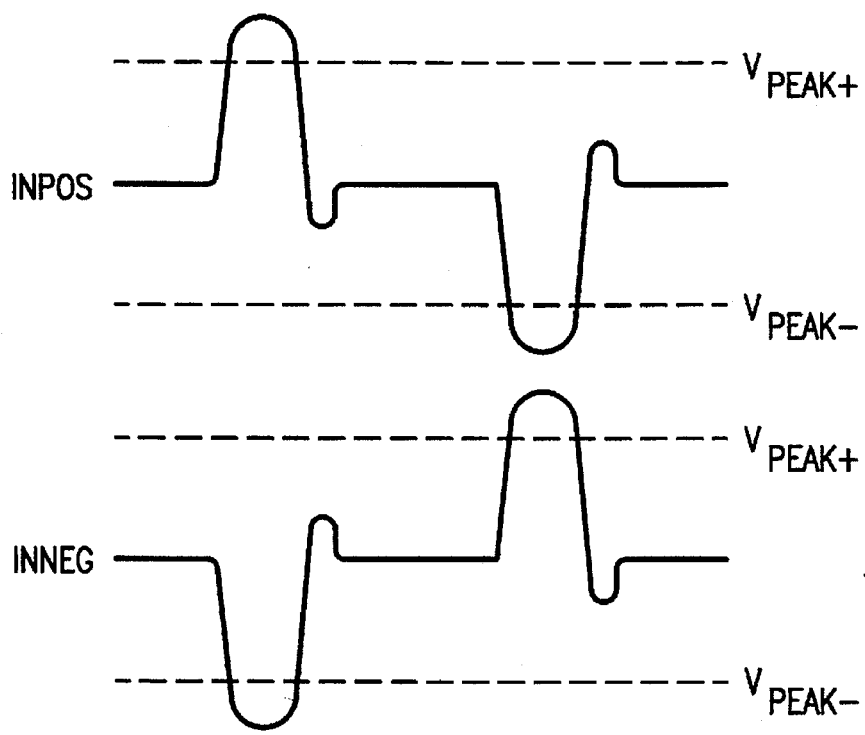
FIG. 3A
FIG. 3B

DIFFERENTIAL CROSS COUPLED PEAK DETECTOR

PARTIAL WAVER OF COPYRIGHT PROTECTION

A portion of the disclosure of this patent document contains material which is subject to copyright protection. The copyright owner has no objection to the facsimile reproduction by any one of the patent disclosure, as it appears in the United States Patent and Trademark office patent files or records, but otherwise reserves all copyright rights whatsoever.

CROSS REFERENCE TO RELATED APPLICATIONS

This application is related to the following U.S. patent applications:

CROSS REFERENCE TO RELATED APPLICATIONS
This application is related to the following U.S. Pat. Appl. No.:

| SER. NO. | TITLE | INVENTOR(S) |
|---|---|---|
| 536897 | Tunable Tone Control Circuit And A Device And Method For Tuning The RC Constants | Whiteside |
| 536895 | Amplifier with Pol/Zero Compensation | Whiteside |
| 536023 | Sample Point Adjustment | Smith et al. |
| 536875 | One's Density Monitor | Smith |
| 536906 | Over Sampled State Machine for Jitter Tolerant Pulse Detection | Smith et al. |

All of the related applications are filed on even date herewith, are assigned to the assignee of the present invention, and are hereby incorporated herein in their entirety by this reference thereto.

BACKGROUND OF THE INVENTION

1. Field of the Invention

The present invention relates generally to electronic circuits. More particularly, the present invention related to voltage peak detector circuits.

2. Description of Related Art

Peak detectors are used in various applications to provide an output voltage equal or representative of the peak voltage of an input signal. These peak detectors are used, by way of example only, in telecommunications applications in which a digital signal is received on a single twisted wire pair. Data must be extracted from the signal. A common method used to extract the data from the signal involves detecting the peak value of the incoming signal while sampling the incoming signal at mid-range intervals.

In U.S. Pat. No. 4,866,301 and U.S. Pat. No. 4,992,674 there is disclosed a peak detector that does not suffer certain disadvantages of peak detectors that came before it. This peak detector, which is discussed in detail below, does not, for example, track errant noise peaks like detectors that came before it, nor does it fail to respond rapidly to falling input signals.

Referring now to FIG. 1, there is shown a peak detector circuit such as that disclosed in U.S. Pat. Nos. 4,866,301 and 4,992,674. This peak detector circuit, generally designated by the reference numeral 10, includes a comparator 12 in which the input signal $V_{IN}$ is connected to the negative input.

The output of the comparator 12 is connected to the gate of a p-channel transistor 14 and also to the gate of an n-channel transistor 16. The source of the p-channel transistor 14 is connected to a charging current source 18, the other end of which is connected to VDD. The source of the n-channel transistor 16 is connected to one end of a discharge current source 20, the other end of which is connected to ground. The drains of the p-channel transistor 14 and the n-channel transistor 16 are connected together and to one end of a holding capacitor 22, the other end of which is connected to ground. The common drain connection of the p-channel transistor 14 and the n-channel transistor 16 is also connected to the gate of an n-channel buffer or isolation transistor 24. The drain of the n-channel buffer transistor 24 is connected to VDD and the source is connected to one end of a third current source 26, the other end of which is connected to ground. The source of the n-channel buffer transistor 24 is also connected to the positive input of the comparator 12 and, further, it forms the peak voltage output signal shown as $V_{PEAK}$ in FIG. 1.

Operation of the peak detector circuit 10 was described in U.S. Pat. Nos. 4,866,301 and 4,992,674 as follows:

1. When the input voltage $V_{IN}$ is greater than the peak output voltage, $V_{PEAK}$, then the output of the comparator 12 will be at a low voltage level such that the p-channel transistor 14 is conductive and the n-channel transistor 16 is nonconductive. When the p-channel transistor 14 is conductive, then current from the current source 18 puts charge onto the holding capacitor 22 to cause the voltage across the holding capacitor 22 to rise. This voltage on the holding capacitor 22 is decreased by the threshold voltage of the n-channel buffer transistor 24 to form the peak output voltage $V_{PEAK}$.

2. When the input signal $V_{IN}$ is less than the peak output voltage $V_{PEAK}$, then the output of the comparator 12 is at a high voltage level such that the p-channel transistor 14 is nonconductive and the n-channel transistor 16 is conductive. Under these conditions the charge on the holding capacitor 22 is discharged through the discharge current source 20 and the voltage across the holding capacitor 22 and, therefore, the voltage at the peak voltage output signal $V_{PEAK}$ is decreasing.

Although the peak detector disclosed in U.S. Pat. Nos. 4,866,301 and 4,992,674 possesses a number of advantages relative to its prior art, it is not without its shortcomings. For example, it cannot react properly to differential alternate mark inversion ("AMI") coding schemes, that is schemes in which zeros are coded as no pulses and ones are coded as alternative differential positive and negative pulses. That is to say, the peak detector disclosed in U.S. Pat. Nos. 4,866, 301 and 4,992,674 cannot properly react to a situation where a differential positive pulse is followed by a differential negative pulse in tracking an AMI signal.

Based upon the foregoing, it should be understood and appreciated that it is a shortcoming and deficiency of the prior art that there has not heretofore been developed a peak detector that can track a fully differential input.

SUMMARY OF THE INVENTION

The present invention overcomes the aforementioned shortcomings and deficiencies of the prior art by providing a circuit for processing an AC signal having a peak to peak envelope associated therewith, this circuit including structure for detecting the upper edge of the peak to peak envelope of the AC signal, structure for detecting the lower edge of the peak to peak envelope of the AC signal, structure for sampling the AC signal at a mid range upper point, and structure for sampling the AC signal at a mid range lower point.

Accordingly, an object of the present invention is to provide a peak detector that can track a fully differential input.

BRIEF DESCRIPTION OF THE DRAWINGS

Other objects, advantages, and novel features of the present invention can be understood by reference to the following detailed description, taken in conjunction with the accompanying drawings in which:

FIG. 1, previously discussed, is a prior act peak detector;

FIG. 3A illustrates a positive input that could be applied to the circuit of FIG. 2; and FIG. 3B illustrates a negative input that could be applied to the circuit of FIG. 2.

DETAILED DESCRIPTION OF A PREFERRED EMBODIMENT

Figure 2:
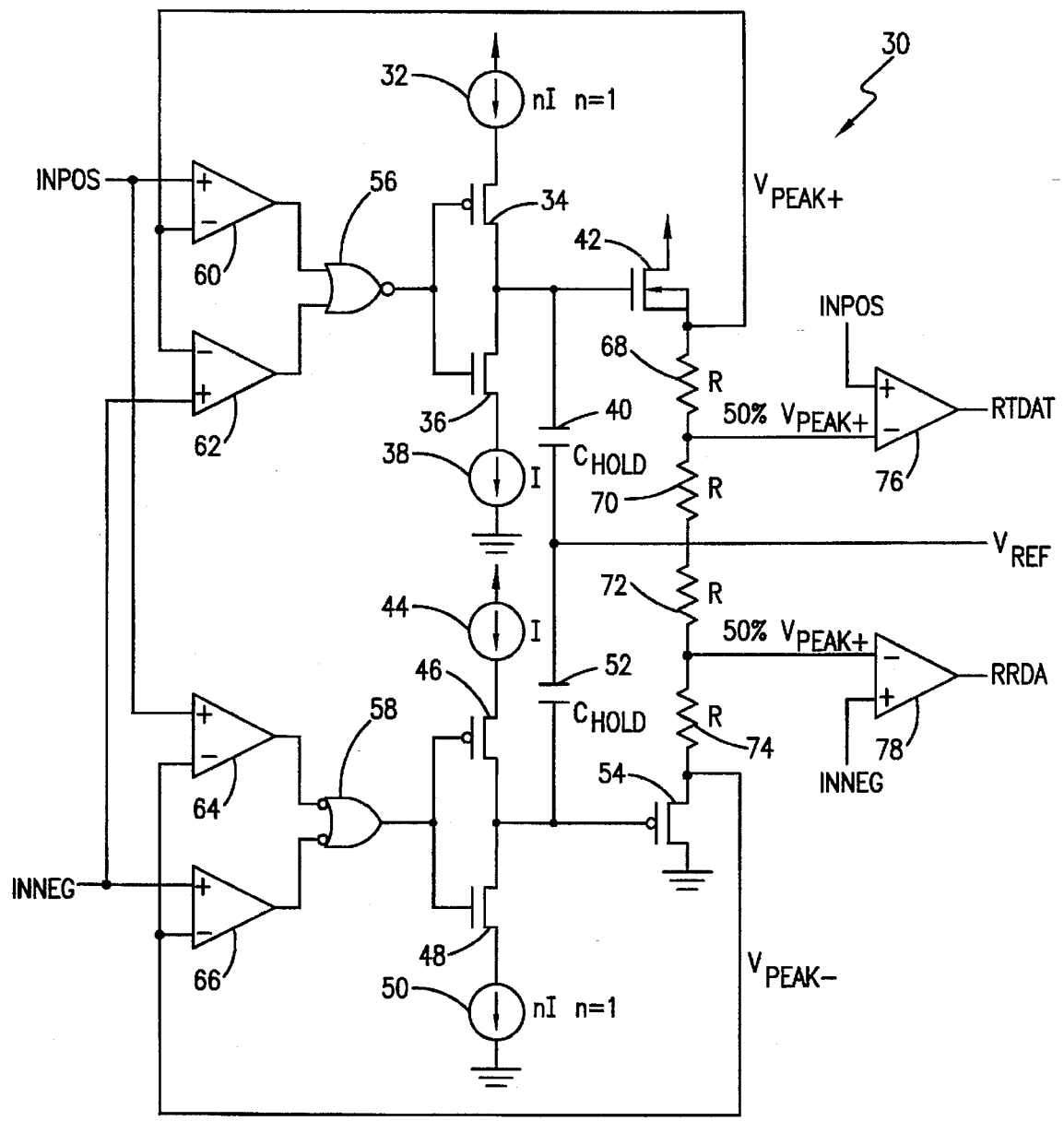
FIG. 2 is a peak detector circuit according to the teachings of the present invention.

Referring now to FIG. 2 there is shown a peak detector circuit, generally designated by reference numeral 30, according to the teachings of the present invention. Although there are a number of fundamental differences between the peak detector circuit 30 and the peak detector circuit 10, which differences are discussed in detail hereinbelow, there are also a number of similarities. To describe the structure and operation of the peak detector circuit 30, it is convenient to discuss those portions of it that are similar, or identical, to portions of the peak detector circuit 10.

As a first point of similarity, it may be noted that the peak detector circuit 30 comprises two portions resembling the circuit 30. In FIG. 2, one of those two portions is depicted generally directly above the other. The uppermost portion comprises, in series, a charging current source 32, a p-channel transistor 34, an n-channel transistor 36, and a discharge current source 38. These elements correspond to the elements 18, 14, 16, and 20, respectively, in the circuit 10 depicted in FIG. 1. Furthermore, the elements 32, 34, 36, and 38 are interconnected as are the elements 18, 14, 16, and 20; that is, the source of the p-channel transistor 34 is connected to the source 32, the source of the n-channel transistor 36 is connected to the source 38, and the drains of the two transistors 34 and 36 are connected together and to one end of a holding capacitor 40 and to the gate of an n-channel transistor 42. The capacitor 40 and the transistor 42 correspond to the elements 22 and 24 in the circuit 10 depicted in FIG. 1.

The bottommost portion of the two portions referred to above is similarly configured; with elements 44, 46, 48, 50, 52, and 54 forming it; like elements 32, 34, 36, 38, 40, and 42 form the uppermost portion discussed above; and like elements 18, 14, 16, 20, 22, and 24 form the circuit 10 depicted in FIG. 1.

Now, it is appropriate to discuss a number of fundamental differences between the circuit 30 and the circuit 10. First, there is a difference in input. While the circuit 10 of FIG. 1 had a single input $V_{IN}$, the circuit 30 receives two input signals, INPOS and INNEG, examples of which are depicted in FIGS. 3A and 3B, respectively. Second, while the gates of transistors 14 and 16 were connected to the output of a single comparator 12, the gates of transistors 34 and 36, and 46 and 48, are connected to the output of a NOR gate 56, and an OR gate where the inputs are inverted, rather than the outputs, as in a standard NOR gate, respectively. The inputs of the gate 56 are connected to the outputs of comparators 60 and 62; and the inputs of the gate 58 are connected to the outputs of comparators 64 and 66. INPOS and INNEG, previously mentioned, are applied to the comparators 60, 62, 64, and 66 as follows: INPOS is applied to the positive inputs of the comparators 60 and 64; and INNEG is applied to the positive inputs of comparators 62 and 66. The negative inputs of the comparators 64 and 66 have a $V_{PEAK-}$ signal applied to them; and the negative inputs of the comparators 60 and 62 have a $V_{PEAK+}$ signal applied to them. The origins of the $V_{PEAK-}$ and $V_{PEAK+}$ signals are discussed further below.

Whereas the end of holding capacitor 22 opposite the end connected to the drains of transistors 14 and 16 is connected to ground (see FIG. 1), the corresponding ends of holding capacitors 40 and 52 are connected together and to $V_{REF}$ (See FIG. 2).

Regarding isolation transistor 42 and p-channel transistor 54, while similar to transistor 24 in FIG. 1 insofar as their sources are connected back to the comparators 60, 62, 64, 66 in the form of $V_{PEAK+}$ and $V_{PEAK-}$ signals, respectively (the precise connections discussed hereinabove and clearly depicted in FIG. 2), they differ from transistor 24 insofar as their sources are also connected via voltage dividers, i.e., a series of resistors 68, 70, 72, 74. A point between resistors 68 and 70 is further connected to the positive input of a comparator 76, and a point between resistors 72 and 74 is further connected to the negative input of a comparator 78. In FIG. 2, it may be seen that the resistors 68, 70, 72, 74 are selected so that the signal on the point between resistors 68 and 70 is 50% $V_{PEAK+}$, and so that the signal on the point between resistors 72 and 74 is 50% $V_{PEAK-}$. It may also be seen in FIG. 2 that INPOS and INNEG are also applied to the positive inputs of the comparators 76 and 78, respectively. The outputs of the comparators 76 and 78 are designated RTDAT and RRDA in FIG. 2.

The circuit of FIG. 2 generally operates as follows:

1) With respect to the upper portion of the circuit 30 depicted in FIG. 2, which portion is concerned with the upper edge of the peak envelope of an incoming AC signal, when $V_{PEAK+}$ is less than INPOS, comparator 60 goes high. Since comparator 62 is held low, gate 56 goes low, which makes transistor 34 conductive and transistor 36 nonconductive. Source 32 then charges $C_{HOLD}$ 40.

2) Also with respect to the upper portion of the circuit 30, when $V_{PEAK+}$ is greater than INPOS, comparators 60 and 62 are both low, causing the output of gate 56 to be high. This makes transistor 36 conductive and transistor 34 nonconductive. In this case, $C_{HOLD}$ 40 is drained to $V_{REF}$.

3) With respect to the bottom portion of the circuit 30 depicted in FIG. 2, which portion is concerned with the lower edge of the peak envelope of an incoming AC signal, when $V_{PEAK-}$ is less than INNEG, comparator 66 goes high. Since comparator 64 is held high, the output of gate 58 is low, which makes transistor 46 conductive and transistor 48 nonconductive. This causes $C_{HOLD}52$ to be drained to $V_{REF}$.

4) Also with respect to the bottom portion of the circuit 30, when $V_{PEAK-}$ is greater than INNEG, then comparator 66 is low. This causes the output of gate 58 to be high, which makes transistor 48 conductive and transistor 46 nonconductive. $C_{HOLD}$ is then charged.

5) The voltage dividers comprising resistors 68 and 70, and 72 and 74, operate with comparators 76 and 78, respectively, by producing high and low outputs as follows.

When INPOS is less than ½ $V_{PEAK+}$, RTDAT is low. When INPOS is greater than ½ $V_{PEAK+}$, RTDAT is high. Similarly, when INNEG is greater than ½ $V_{PEAK-}$, the output of comparator 78, RRDA, is high. On the other hand, when INNEG=½ $V_{PEAK-}$, RRDA is low.

Based upon the foregoing, those skilled in the art should now fully understand and appreciate how the circuit 30 detects the peak to peak envelope of an incoming AC signal. The circuit 30 tracks the lower, as well as the upper, edge of such a signal. This capability provides enhanced ability to react properly to a differential AMI signal.

Obviously, numerous modifications and variations are possible in view of the teachings herein. Accordingly, within the scope of the appended claims, the present invention may be practiced otherwise than as specifically described herein.

What is claimed is:

1. A circuit for processing an AC signal having a peak to peak envelope associated therewith, the envelope having an upper edge, a lower edge and an intermediate edge therebetween, said circuit comprising:

means for detecting the upper edge of the peak to peak envelope of the AC signal, said means for detecting the upper edge including a first comparator, a second comparator, and a NOR gate having two inputs, each of said two inputs of said NOR gate being connected to one of said first and second comparators;

means for detecting the lower edge of the peak to peak envelope of the AC signal;

means coupled to said means for detecting the upper edge for detecting the AC signal at a mid range upper point, said mid range upper point occurring between the intermediate edge and the upper edge of the peak to peak envelope, including a first output; and means coupled to said means for detecting the lower edge for detecting the AC signal at a mid range lower point, said mid range lower point occurring between the intermediate edge and the lower edge of the peak to peak envelope, including a second output.

2. A circuit as recited in claim 1, wherein said means for detecting the lower edge of the peak to peak envelope includes a third comparator, a fourth comparator, and an OR gate having two inverted inputs, each of said inverted inputs of said OR gate is connected to one of said third and fourth comparators.

3. A circuit as recited in claim 2, further comprising at least one voltage divider coupled between said means for detecting the upper edge and said means for detecting the AC signal at a mid range upper point.

4. A circuit as recited in claim 2, further comprising a first and a second voltage divider, said first voltage divider coupled between said means for detecting the upper edge and said means for detecting the AC signal at a mid range upper point, said second voltage divider coupled between said means for detecting the lower edge and said means for detecting the AC signal at a mid range lower point.

5. A circuit as recited in claim 4, wherein said means for detecting the AC signal at a mid range upper point includes a comparator coupled to said first voltage divider.

6. A circuit as recited in claim 4, wherein said means for detecting the AC signal at a mid range lower point includes a comparator coupled to said second voltage divider.

7. A circuit for processing an AC signal having a peak to peak envelope associated therewith, the envelope having an upper edge, a lower edge and an intermediate edge therebetween, said circuit comprising:

means for detecting said upper edge of peak to peak envelope of the AC signal;

means for detecting said lower edge of peak to peak envelope of the AC signal, said means for detecting said lower edge comprises a first and a second comparator, and an OR gate having two inverted inputs, each of which two inverted inputs is connected to one of said first and second comparators;

means coupled to said means for detecting the upper edge for detecting the AC signal at a mid range upper point, said mid range upper point occurring between the intermediate edge and the upper edge of the peak to peak envelope, including a first output; and means coupled to said means for detecting the lower edge for sampling the AC signal at a mid range lower point, said mid range lower point occurring between the intermediate edge and the lower edge of the peak to peak envelope, including a second output.

8. A circuit as recited in claim 7, wherein said means for detecting the upper edge of the peak to peak enveloper of the AC signal includes a third comparator, a fourth comparator, and a NOR gate having two inputs, each of said inputs of said NOR gate being connected to one of said third and fourth comparators.

9. A circuit as recited in claim 7, further comprising at least one voltage divider coupled between said means for detecting the upper edge and said means for detecting the AC signal at a mid range upper point.

10. A circuit as recited in claim 7, further comprising a first and a second voltage divider, said first voltage divider coupled between said means for detecting the upper edge and said means for detecting the AC signal at a mid range upper point, said second voltage divider coupled between said means for detecting the lower edge and said means for detecting the AC signal at a mid range lower point.

11. A circuit for processing an AC signal having a peak to peak envelope associated therewith, said envelope having an upper edge, a lower edge and an intermediate edge therebetween, said circuit comprising:

a first detector for detecting the upper edge of the peak to peak envelope of the AC signal, said means for detecting the upper edge including a first comparator, a second comparator, and a NOR gate having two inputs, each of said two inputs of said NOR gate being connected to one of said first and second comparators;

second detector for detecting the lower edge of the peak to peak envelope of the AC signal;

third detector coupled to said first detector for detecting the AC signal at a mid range upper point, said mid range upper point occurring between the intermediate edge and the upper edge of the peak to peak envelope, including a first output; and fourth detector coupled to said second detector for detecting the AC signal at a mid range lower point, said mid range lower point occurring between the intermediate edge and the lower edge of the peak to peak envelope, including a second output.

12. A circuit as recited in claim 11, wherein said second detector includes a third comparator, a fourth comparator, and an OR gate having two inverted inputs, each of said two inverted inputs being connected to one of said third and fourth comparators.

13. A circuit as recited in claim 11, further comprising at least one voltage divider coupled between said first detector and said third detector.

14. A circuit as recited in claim 11, further comprising a first and second voltage divider, said first voltage divider coupled between said first detector and said third detector, and said second voltage divider coupled between said second detector and said fourth detector.

15. A circuit as recited in claim 14, wherein said third detector includes a comparator coupled to said first voltage divider.

16. A circuit as recited in claim 14, wherein said fourth detector includes a comparator coupled to said second voltage divider.

* * * * *

UNITED STATES PATENT AND TRADEMARK OFFICE
CERTIFICATE OF CORRECTION

PATENT NO.    :    5,631,584
DATED         :    May 20, 1997
INVENTOR(S)   :    Smith It is certified that error appears in the above-indentified patent and that said Letters Patent is hereby corrected as shown below:

Column 1, line 28      Replace "Pol/Zero"
                           With --Pole/Zero--

Signed and Sealed this

Sixteenth Day of December, 1997

Attest:

BRUCE LEHMAN

*Attesting Officer*           *Commissioner of Patents and Trademarks*